United States Patent [19]

Hesson

[11] Patent Number: 5,165,046

[45] Date of Patent: Nov. 17, 1992

[54] HIGH SPEED CMOS DRIVER CIRCUIT

[75] Inventor: James H. Hesson, Boise, Id.

[73] Assignee: Micron Technology, Inc., Boise, Id.

[21] Appl. No.: 577,381

[22] Filed: Sep. 4, 1990

Related U.S. Application Data

[63] Continuation-in-part of Ser. No. 433,353, Nov. 6, 1989, abandoned.

[51] Int. Cl.⁵ .................. H03K 3/01; H03K 3/289
[52] U.S. Cl. ................... 307/270; 307/451; 307/473; 307/310; 307/272.2; 307/491
[58] Field of Search ............... 307/443, 448, 451, 473, 307/270, 310, 272.2, 491, 310

[56] References Cited

U.S. PATENT DOCUMENTS

| | | | |
|---|---|---|---|
| 4,414,480 | 11/1983 | Zasio | 307/270 |
| 4,612,466 | 9/1986 | Stewart | 307/270 |
| 4,707,620 | 11/1987 | Sullivan et al. | 307/270 |
| 4,841,170 | 6/1989 | Eccleston | 307/310 |
| 4,859,877 | 8/1989 | Cooperman et al. | 307/270 |
| 4,952,818 | 8/1990 | Erdelyi et al. | 307/270 |
| 4,980,586 | 12/1990 | Sullivan et al. | 307/310 |
| 5,001,369 | 3/1991 | Lee | 307/473 |
| 5,095,231 | 3/1992 | Sartori et al. | 307/270 |

Primary Examiner—William L. Sikes
Assistant Examiner—Margaret Rose Wambach
Attorney, Agent, or Firm—Angus C. Fox, III

[57] ABSTRACT

A high-speed CMOS driver circuit which compensates for the intervening transmission line effects resulting from the existence of a printed circuit board, or a ceramic or silicon substrate between the coupled CMOS devices, thus preventing significant signal degradation. Several techniques are employed to increase circuit speed. Firstly, P-channel and N-channel output drivers are sized so that the characteristics impedance of each of the devices matches the characteristic impedance of its associated transmission line (whether it be on a printed circuit board or on a ceramic or silicon substrate). A printed circuit board transmission line may be of either the microstrip or stripline variety. Secondly, since P-channel and N-channel output drivers must be capable of delivering relatively high current, it is therefore highly desirable to eliminate or greatly reduce any crowbar current that could flow during the brief transition state when both N-channel and P-channel devices are on. Several preferred circuit designs are identified for the reduction or elimination of this crowbar current.

7 Claims, 5 Drawing Sheets (PROBLEM STATEMENT)
(PRIOR ART)

HIGH SPEED CMOS DRIVER CIRCUIT

This application is a continuation-in-part of application Ser. No. 07/433,353 that was filed on Nov. 6, 1989, now abandoned.

FIELD OF INVENTION

This invention relates to solid-state digital switching circuitry and, more specifically, to high-speed CMOS driver circuits.

BACKGROUND OF THE INVENTION

Smaller integrated circuit geometries and advanced processing techniques have made it possible to achieve on-chip switching times of 120 ps to 250 ps per gate in CMOS integrated circuits. However, the signal handling capability of contemporary printed circuit boards and data processing systems is not on par with switching speeds of that order of magnitude, thus resulting in substantial signal degradation. Consequently, there is a critical need to develop techniques that will permit more effective interfacing of high-speed integrated circuits with printed circuit boards and ceramic or silicon substrates.

The proper driver matching impedance is derived from the drain current of the driver device. The drain current, $I_D$, of a CMOS device is given approximately by the following equation:

$$I_D = \mu_o C_o W/L \; [(V_{GS} - V_T) - (V_{DS}/2)] \; V_{DS}(1 + \lambda V_{DS})$$

where $\mu_o$ = surface mobility of the channel in $cm^2/v\text{-}s$;
$C_o$ = capacitance per unit area of gate oxide;
$W$ = effective channel width;
$V_{GS}$ = gate-to-source voltage;
$V_T$ = threshold voltage; and
$\lambda V_{DS}$ = the channel length modulation parameter.

The "on" resistance, $R_{ON}$, is equal to the reciprocal of the partial derivative of the drain current with respect to the partial derivative of the drain-to-source voltage. That is:

$$R_{ON} = (\alpha I_D / \alpha V_{DS})^{-1})$$

Since $\alpha I_D / \alpha V_{DS} \approx \mu_o C_o W/L \; [(V_{GS} - V_T) - (V_{DS}/2)]$, $R_{ON} \approx L/\mu_o C_o W(V_{GS} - V_T)$ for small values of $V_{DS}$.

A typical CMOS-to-printed circuit board (ceramic or silicon substrate) interface is illustrated in FIG. 1. In this graphic statement of the problem, the assumption is made that the transmission line is lightly loaded, having only a single lumped reactance Z1, consisting of a shunt resistor R1 and shunt capacitor C1. Capacitor C1 is considered to be associated with the combined capacitance of the receiver integrated circuit input capacitance and any additional stray capacitance at this junction. The resistance of resistor R1 is typically very high and may, therefore be ignored.

As the driver inputs 12 are driven from a low to high state, P-channel output driver transistor Q1 is operating initially in the saturation region, behaving as an ideal current source that delivers maximum current to the destination load and transmission line reactance. N-channel output driver transistor Q2, on the other hand, is initially in a turned-off state, behaving as an open circuit. As the voltage level on the gates of transistors Q1 and Q2 increases and the drain-to-source voltage decreases below the $(V_{GS} - V_T)$ voltage, both devices begin to operate in their linear regions, where the $R_{ON}$ of each device remains nearly constant. While the devices operate in their linear regions, the transmission line is, in effect, terminated with a series termination resistance, $R_{ON}$, the magnitude of which is matched to that of the transmission line. It is during this period when transistors Q1 and Q2 are operating in their linear regions (i.e., both devices are partially "on") that "crowbar" current will flow to ground. At the end of the low-to-high transition period, N-channel transistor Q2 becomes an ideal current source, tying the transmission line to ground, while P-channel transistor Q1 enters its high-resistance, turned-off state.

Matching the impedance of a driver circuit directly to that of the transmission line is preferable to using an unmatched driver interfaced to a transmission line having a series resistance termination consisting of either thin film resistors incorporated on the chip or within the package, or external resistors. This is so because, during transitions from low-to-high or high-to-low states, maximum drive current is available from the output driver. In comparison, when a series termination is used, suboptimal resistance choices are made as the designer attempts to maintain an acceptable level of drive current, while attempting to match transmission line impedance.

Characteristic impedance will be summarized for several types of transmission lines and various operating conditions. The $R_{ON}$ impedance of the N-channel and P-channel output driver transistors is optimally sized to match the given condition over the operating temperature range.

The characteristic impedance of a wire over a ground plane is given by the following formula:

$$Z_O = (60/e_r^{\frac{1}{2}}) \ln(4h/d)$$

where
h = the height of the center of the wire over the ground plane,
d = the diameter of the wire, and
$e_r$ = the effective dielectric constant surrounding the wire.

The characteristic impedance of a microstrip line is given by the following formula:

$$Z_O = [87/(e_r + 1.41)^{\frac{1}{2}}][\ln(5.98h/0.8w + t)]$$

where
w = the width of the line,
t = the thickness of the line,
h = the height of the line from the ground plane, and
$e_r$ = is effective dielectric constant of the medium between the line and the ground plane.

The characteristic impedance of strip line, on the other hand, is given by the following formula:

$$Z_O = [60/e_r^{\frac{1}{2}}][\ln[4(2h + t)/0.67\pi w(0.8 + t/w)]]$$

where
w = the width of the strip line,
h = the distance from the strip line to each of the ground planes,
t = the thickness of the strip line, and
$e_r$ = the relative dielectric constant of the board material.

The characteristic impedance of a microstrip or strip line modified by lumped capacitive loads is given by the following formula:

$$\hat{Z}_O = Z_O/(1 + C_D/C_O)^{\frac{1}{2}}$$

where
$C_D$ = the lumped capacitive load, and
$C_O$ = the capacitance associated with the characteristic impedance.

There are a number of problems associated with the creation of high-speed driver circuits. In order to match the impedance of a microstrip or stripline transmission line, a driver must be capable of high-current output to match the relatively high impedance of a microstrip or stripline transmission line. The high current required for impedance matching will likely result in the generation of high levels of crowbar current during the brief transition period when input shifts from low to high or high to low. If many devices within the circuit are simultaneously switching (a common occurrence in complex circuits), the crowbar current may well reach dangerously-high levels, thus overtaxing the power supply and resulting in unacceptably low voltage levels being delivered to the circuitry. In addition, since impedance is temperature related, a condition of matched impedance at one temperature will likely be a significant mismatch at another temperature.

A number of circuit designers have attempted to address the problems related to matching a driver circuit with the load. For example, in U.S. Pat. No. 4,414,480, which was issued in 1983 to John J. Zasio and is entitled "CMOS Circuit Using Transmission Line Interconnections", a CMOS driver circuit having impedance matched to the load is disclosed. However, this circuit ignores both the inevitable crowbar current effect and the effect of temperature on impedance. Another U.S. patent (U.S. Pat. No. 4,719,369) issued to Michio Asano, et al, and entitled "Output Circuit Having Transistor Monitor for Matching Output Impedance to Load Impedance", a CMOS driver circuit is disclosed which attempts to deal with the temperature effect on impedance. In this circuit, impedance is varied discontinuously, in order to approximate the impedance of the load, by means of a pair of analog-to-digital converters, each of which receives its input signal from a monitor MOSFET, the impedance of which varies with ambient temperature. Such an arrangement suffers from several drawbacks. First, the circuit is complex, relatively large, and subject to error in the high-noise environment of a high-speed digital circuit. The inventor states that his device is particularly useful for dealing with impedance variations due to variations in the manufacturing process. However, temperature variation plays a far more significant role in impedance variation within a CMOS driver circuit created with a well-controlled process. In fact, approximately ninety percent of the impedance variation is due to temperature. Like the circuit of the Zasio patent, the circuit of the Asano, et al, patent also ignores the crowbar current effect. Neither of the aforementioned patents makes mention of the need to match the combined transmission line and lumped parameter capacitive impedance. Although the lumped parameter capacitive loading is negligible for long transmission lines, it is particularly significant for transmission lines in the 2.5 cm to 15 cm range.

SUMMARY OF THE INVENTION

The primary objective of this invention is to provide an improved, high-speed output driver for CMOS integrated circuits which compensates for intervening transmission line effects between coupled CMOS devices mounted at different locations on either printed circuit boards or on substrates of ceramic or silicon, thereby minimizing signal degradation.

The improved output driver incorporates several techniques to accomplish the aforementioned objective. Firstly, P-channel and N-channel output drivers are sized so that the characteristic "on" impedance of each of the devices matches the combined characteristic impedance of its associated transmission line and associated capacitive load (whether it be on a printed circuit board or on a ceramic or silicon substrate). Transmission lines on printed circuit boards and substrates may be of either the microstrip or stripline variety. Secondly, since P-channel and N-channel output driver transistors must be capable of delivering relatively high current (e.g., they must deliver approximately 100 ma of current using a 5-volt supply voltage in order to match the 50-ohm impedance of a printed circuit board), it is therefore highly desirable to eliminate or greatly reduce any crowbar current flows during the brief transition state when both N-channel and P-channel output driver transistors are on. Several preferred circuit designs are identified for the reduction or elimination of this crowbar current effect. Thirdly, since the resistive component of characteristic on-impedance of the drivers will vary as a function of temperature, it is desireable that temperature be controlled within a narrow range to prevent significant impedance-match variations. Several techniques exist for controlling the temperature of an integrated circuit. Forced air, liquid, or thermoelectric cooling are several useable techniques.

PREFERRED EMBODIMENT OF THE INVENTION

In order optimize a CMOS driver circuit for high-speed operation, it is essential that P-channel and N-channel output transistors (drivers) be sized so that the characteristic "on" impedance of each matches the combined characteristic impedance of the associated transmission line and the associated capacitive load. In order to match the 25 to 50 ohm impedance of a printed circuit board, the P-channel and N-channel drivers must be sized to deliver between 50 to 100 miliamps of current from a 5-volt supply voltage. The supply voltage, which provides a high logic level reference, is generally designated $V_{DD}$, while ground potential, which provides a low logic level reference, is typically designated $V_{SS}$. Because of this relatively high current, it is essential to eliminate or greatly reduce any crowbar current that flows from $V_{DD}$ to ground during the brief transition state when both N-channel and P-channel drivers are on. In addition, since the resistive component of characteristic on-impedance of the drivers will vary as a function of temperature, it is desirable that temperature be controlled within a narrow range to prevent significant impedance-match variations.

Figure 1:
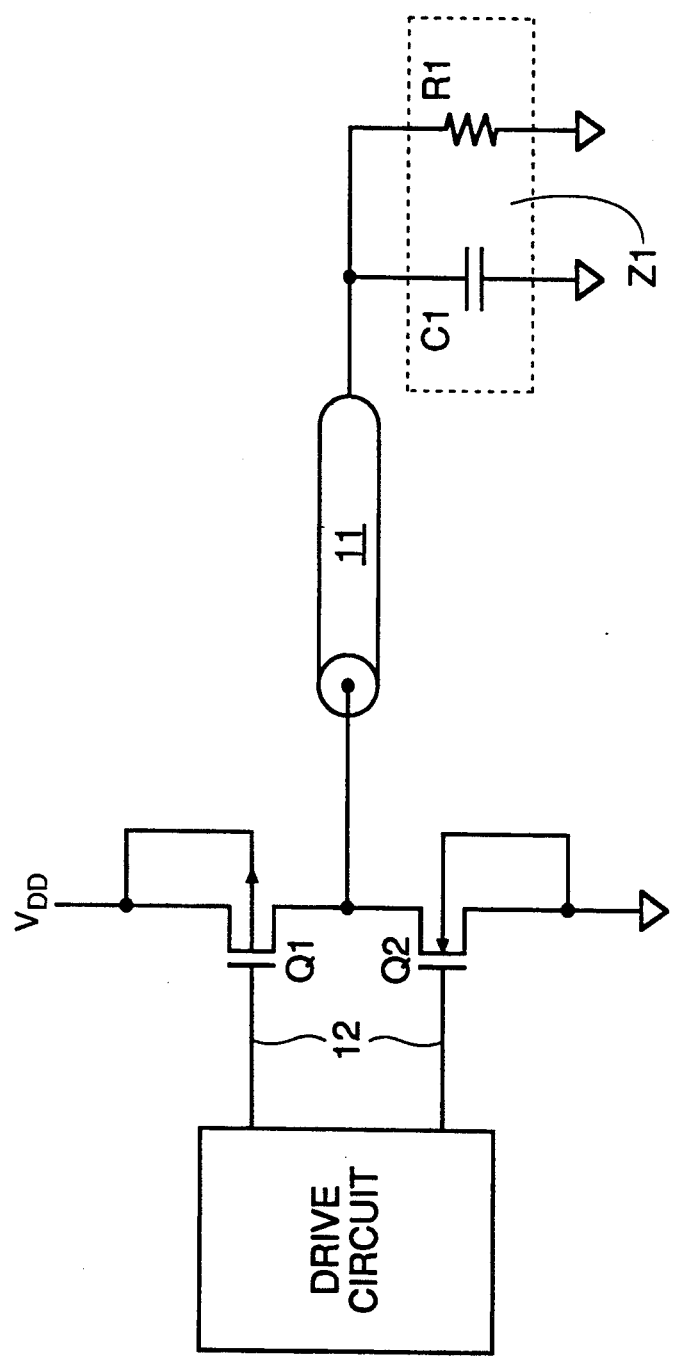
FIG. 1 is a graphic statement in block diagram form of the problem (i.e., that of driving a transmission line with a CMOS output driver)
Figure 2:
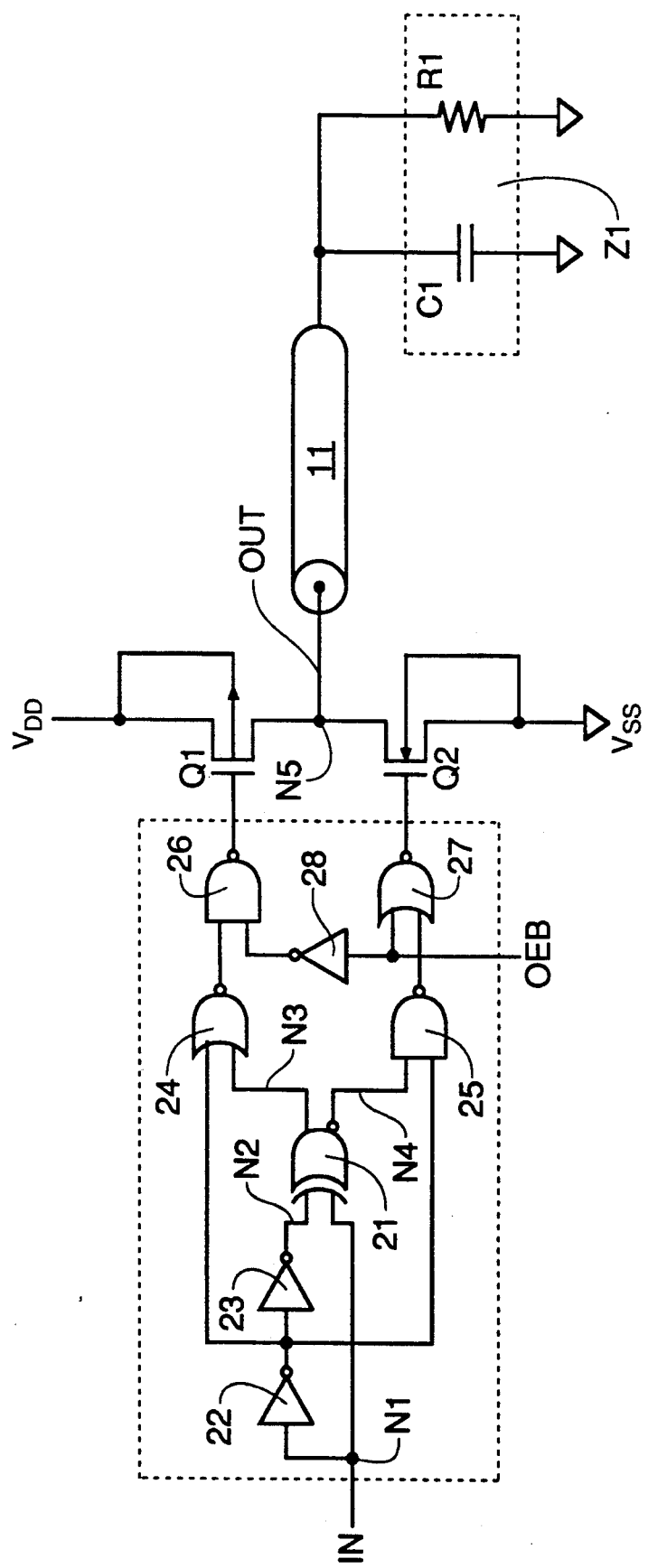
FIG. 2 is a schematic block diagram of a first embodiment of a high-speed CMOS driver circuit, employing tri-state blanking of crowbar-current during input transitions from low to high.

FIGS. 2 and 4A depict several high-speed CMOS driver circuits which are immune to crowbar current flow during transitions from a low-to-high and high-to-low states.

Referring now to FIG. 2, a first embodiment of a high-speed driver circuit incorporating a tri-state blanking function during low-to-high and high-to-low transitions is shown. An input signal is fed both directly and delayed to an XOR gate 21, the delay being accomplished by first and second inverters 22 and 23, respectively. The XOR gate has both true and complement outputs, the true output going to first NOR gate 24 and the complement output going to first NAND gate 25. The other input of NOR gate 24 and NAND gate 25 are fed by the output of inverter 21. The output of NAND gate 26 and an output enable bar signal provide the inputs for second NOR gate 27, whereas the output of NOR gate 24 and the complement of the OEB signal generated by inverter 28 feed a second NAND gate 26. NAND gate 26, in turn drives the gate of the output P-channel transistor Q1. NOR gate 27, on the other hand, drives the gate of the output N-channel transistor Q2.

Figure 3:
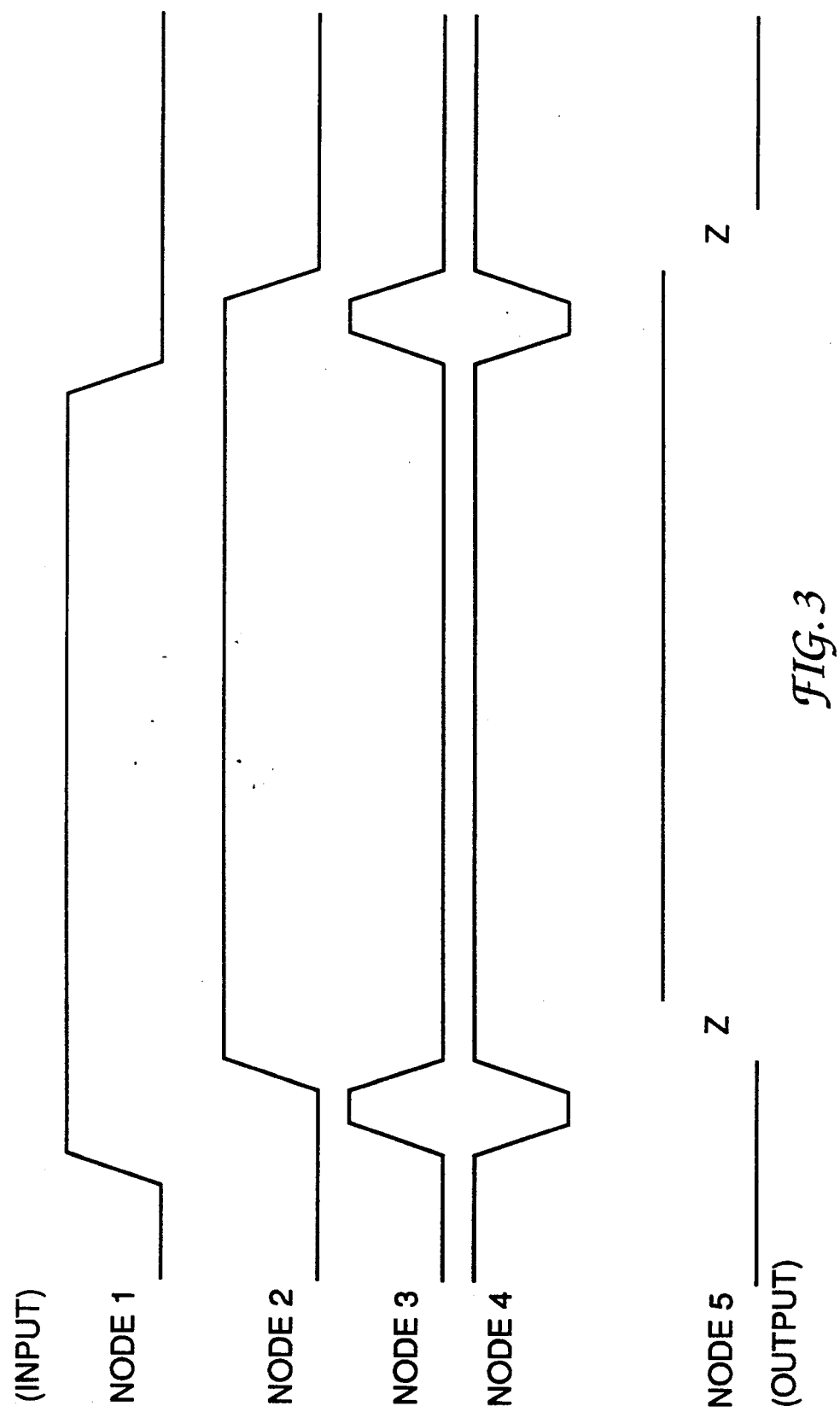
FIG. 3 is a series of synchronized voltage waveforms for different nodes within the circuit depicted in FIG. 2.

FIG. 3 depicts a series of synchronized voltage waveforms for different nodes within the circuit depicted in FIG. 2. At node 5 (N5), the pulse blanking (high-impedance, tri-state) is clearly shown for both the low-to-high and high-to-low input transitions.

Figure 4:
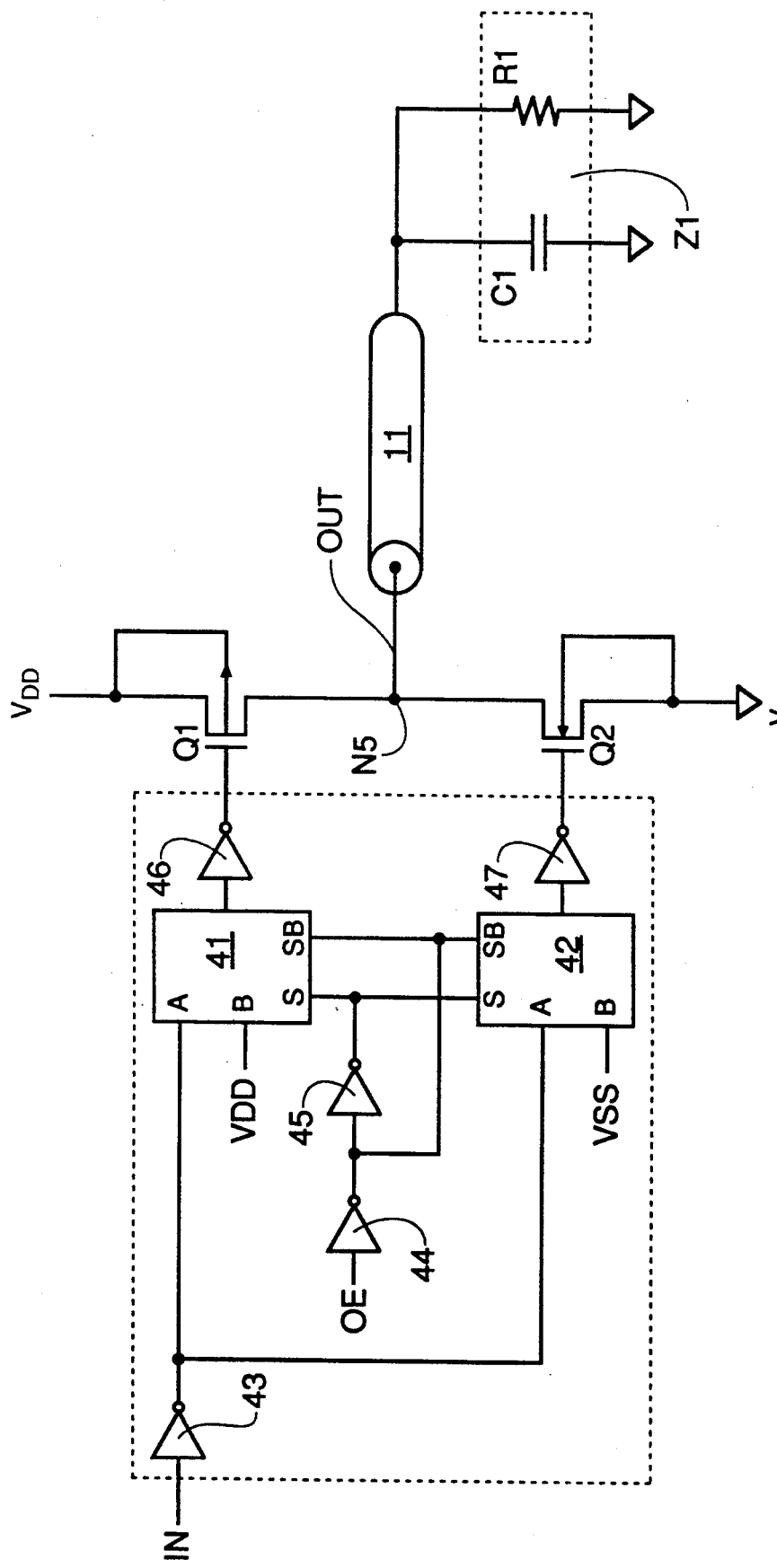
FIG. 4 is a schematic block diagram of a third embodiment of a high-speed CMOS output driver circuit, employing balanced signal paths, via a pair of inverting multiplexers, to minimize crowbar current during input transitions from low to high.

Referring now to FIG. 4, a second embodiment of a high-speed CMOS driver circuit provides well-balanced paths for the gates of both output transistors Q1 and Q2 to minimize potential crowbar current. This method, although effective, will not absolutely guarantee the elimination of crowbar current in the output transistors Q1 and Q2.

The circuit employs a pair of identical inverting multiplexers 41 and 42. Each of the multiplexers has four input terminals which are labeled A, B, S and SB. An input signal IN, following inversion by inverter 43, is directed to the "A" terminal of each multiplexer. The "B" input terminals of multiplexers 41 and 42 are connected to $V_{DD}$ and $V_{SS}$, respectively. The "S" input terminal of each multiplexer is connected to an output enable signal OE, which is delayed by serially-connected inverters 44 and 45. The "SB" terminals of each multiplexer, on the other hand, are connected to signal OE through inverter 44. This inverted OE signal is also referred to as OEB (output enable bar) or OE*. The gate of transistor Q1 is controlled by the inverted output of multiplexer 41, which is inverted once again by inverter 46 before reaching the gate of transistor Q1. Likewise, the gate of transistor Q2 is controlled by the inverted output of inverting multiplexer 42, which is inverted again by inverter 47 before reaching the gate of transistor Q2.

Figure 5:
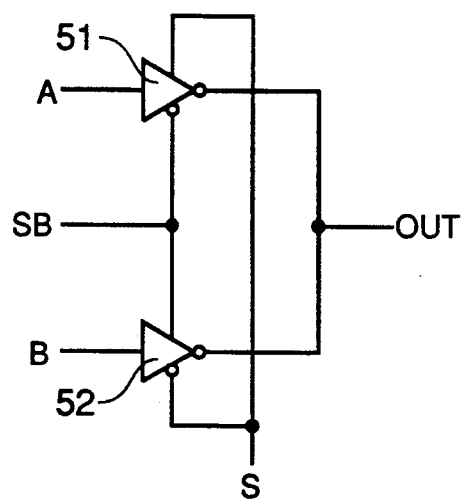
FIG. 5 is a schematic logic diagram of an inverting multiplexer.

Referring now to FIG. 5, each of the identical multiplexers, 41 and 42, depicted in FIG. 4 is constructed from a pair of tri-state inverters 51 and 52 connected in a "wired OR" configuration. Each of the tri-state inverters has both an enable input and an enable bar input (the latter being designated by the small circle at the left of the device). The "A" input of tri-state inverter 51 is equivalent to the "A" terminal of either multiplexer 41 or multiplexer 42, while the "B" input of tri-state inverter 52 is equivalent to the "B" terminal of each multiplexer 41 or multiplexer 42. The "S" terminal of each multiplexer is connected to the enable bar input of tri-state inverter 51, and to the enable input of tri-state inverter 52. The "SB" terminal, on the other hand, is connected to the enable input of tri-state inverter 51, and to the enable bar input of tri-state inverter 52.

Figure 6:
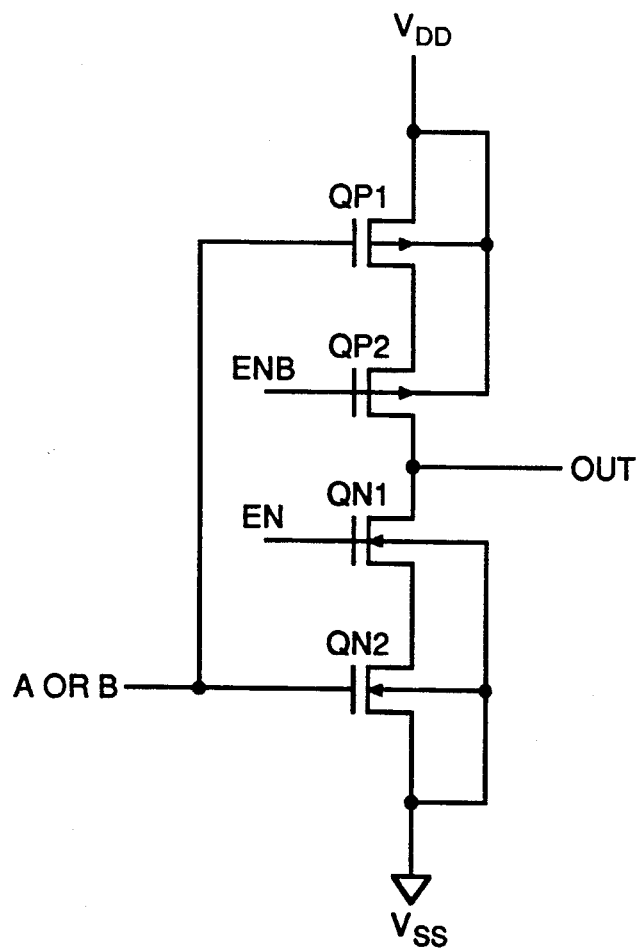
FIG. 6 is a schematic circuit diagram, at the component level, of the inverting multiplexer depicted in FIG. 5.

Referring now to FIG. 6, each tri-state inverter 52 is constructed form a pair of P-channel MOSFETs (QP1 and QP2) and a pair of N-channel MOSFETS (QN1 and QN2). The channels of QP1 and QP2 are serially connected between $V_{DD}$ and the output node OUT, while the channels of QN1 and QN2 are serially connected between $V_{SS}$ and output node OUT. The "A" or "B" input is fed to the gate of QP1 and QN2. The gate of MOSFET QP2 is designated as the enable bar (ENB) input of both tri-state inverters (51 and 52), while the gate of MOSFET QN1 is designated as the enable input (EN).

Although only several embodiments of the high-speed CMOS driver circuit have been disclosed herein, it will be apparent to one having ordinary skill in the art, that changes may be made thereto without departing from the spirit and the scope of the invention as claimed. For example, the scope of this patent is also intended to apply to a transmission line that has several discrete lumped capacitances along the length of the printed circuit board (ceramic or silicon substrate) transmission line. In this case, the $R_{ON}$ has to be sized to take into account the variation of the printed circuit board's characteristic impedance by the lumped capacitances. The lumped capacitances are typically due to other integrated circuit input/output nodes.

I claim:

1. A high-speed CMOS circuit for driving an input signal, said CMOS circuit providing, at an output node, an output signal which is coupled to a receiver circuit via a transmission line characterized by a lumped capacitive load, said CMOS circuit comprising:
    a P-channel, field-effect, output driver transistor connected between a high logic level reference voltage and the output node, the "on" impedance ($R_{ON}$) of said P-channel output driver transistor being matched to the characteristic impedance of the transmission line, said P-channel output driver transistor having a control gate;
    an N-channel, field-effect, output driver transistor connected between a low logic level reference voltage and the output node, the "on" impedance ($R_{ON}$) of said N-channel output driver transistor being matched to the characteristic impedance of the transmission line, said N-channel output driver transistor having a control gate;
    a predriver circuit which, in response to the input signal and an output enable signal, provides blanking pulses to both control gates so as to tri-state the driver output during periods of input signal transition from low-to-high and high-to-low states, said blanking pulses being created by separate input signal paths for each of the output driver transistors;

one path having as an input the true output of an XOR gate;

the other path having as an input the complement output of the XOR gate, said XOR gate having a pair of inputs, one of which is the input signal, the other being a delayed version of the same.

2. The high-speed CMOS circuit of claim 1 wherein an output enable signal forces both the N-channel and P-channel output drivers to a high-impedance state.

3. A high-speed CMOS circuit for driving an input signal, said CMOS circuit providing, at an output node, an output signal which is coupled to a receiver circuit via a transmission line characterized by a lumped capacitive load, said CMOS circuit comprising:

a P-channel, field-effect, output driver transistor connected between a high logic level reference voltage and the output node, the "on" impedance ($R_{ON}$) of said P-channel output driver transistor being matched to the characteristic impedance of the transmission line, said P-channel output driver transistor having a control gate;

an N-channel, field-effect, output driver transistor connected between a low logic level reference voltage and the output node, the "on" impedance ($R_{ON}$) of said N-channel output driver transistor being matched to the characteristic impedance of the transmission line, said N-channel output driver transistor having a control gate;

a predriver circuit which drives both control gates in response to the input signal and an output enable signal in a coordinated sequence that ensures that both output driver transistors are never simultaneously "on" during periods of input signal transition from low-to-high and high-to-low states, said predriver circuit having a first signal path for the P-channel transistor control gate and a second signal path for the N-channel transistor control gate, said first and second signal paths having identical multiplexers and P-channel gate signal which generate identical signal delays.

4. The high-speed CMOS circuit of claim 3 wherein each multiplexer is formed by a "wired OR" configuration of two tri-state inverters.

5. The high-speed CMOS circuit of claim 4 wherein an output enable signal forces both the N-channel and P-channel output drivers to a high-impedance state.

6. A high-speed CMOS circuit for driving an input signal, said CMOS circuit providing, at an output node, an output signal which is coupled to a receiver circuit via a transmission line characterized by a lumped capacitive load, said CMOS circuit comprising:

a P-channel, field-effect, output driver transistor connected between a high logic level reference voltage and the output node, the "on" impedance ($R_{ON}$) of said P-channel output driver transistor being matched to the characteristic impedance of the transmission line, said P-channel output driver transistor having a control gate;

an N-channel, field-effect, output driver transistor connected between a low logic level reference voltage and the output node, the "on" impedance ($R_{ON}$) of said N-channel output driver transistor being matched to the characteristic impedance of the transmission line, said N-channel output driver transistor having a control gate;

a predriver circuit which drives both control gates in response to the input signal and an output enable signal in a coordinated sequence that ensures that both output driver transistors are never simultaneously "on" during periods of input signal transition from low-to-high and high-to-low states;

said predriver circuit having a first signal path for the P-channel transistor control gate and a second signal path for the N-channel transistor control gate;

each gate signal path having a set of series-connected logic gates, the gates of one path being cross-coupled with the state of the other path and arranged to as to provide a delay in one of the paths during periods of input signal transition, so that an output driver transistor that is "on" at the onset of such a period is shut "off" prior to the other output driver transistor being turned on;

the logic gates of said first signal path comprising a first NAND gate and a first NOR gate, and the logic gates of said second signal path comprising a second NAND gate and a second NOR gate;

said first NAND gate having as inputs said input signal and the output of said second NAND gate;

said first NOR gate having as inputs the output of said first NAND gate and the complement of said output enable signal;

said second NAND gate having as inputs the output of said second NOR gate and said output enable signal; and said second NOR gate having as inputs said input signal and the output of said first NOR gate.

7. The high-speed CMOS circuit of claim 6, wherein said first gate signal path further comprises a first inverter, which is placed in series between the output of said first NOR gate and the gate of said P-channel output driver transistor, and said second gate signal path further comprises a second inverter, which is placed in series between the output of said second NAND gate and the gate of said N-channel output driver transistor.

* * * * *